(12) United States Patent
Itoh

(10) Patent No.: US 7,250,749 B2
(45) Date of Patent: Jul. 31, 2007

(54) CURRENT SENSOR

(75) Inventor: Tomoki Itoh, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/583,010

(22) Filed: Oct. 19, 2006

(65) Prior Publication Data

US 2007/0090826 A1    Apr. 26, 2007

(30) Foreign Application Priority Data

Oct. 21, 2005    (JP) .............................. 2005-307482

(51) Int. Cl.
*G01R 15/20* (2006.01)
(52) U.S. Cl. .................................................. 324/117 H
(58) Field of Classification Search ............ 324/117 H, 324/765, 158.1, 127, 126, 117 R
See application file for complete search history.

(56) References Cited

U.S. PATENT DOCUMENTS 4,059,798 A * 11/1977 Dierker et al. .............. 324/127

4,639,665 A * 1/1987 Gary ....................... 324/117 H

FOREIGN PATENT DOCUMENTS

| JP | A-08-15321  | 1/1996 |
| JP | A-08-15322  | 1/1996 |
| JP | A-10-73619  | 3/1998 |
| JP | A-11-258275 | 9/1999 |

* cited by examiner

*Primary Examiner*—Ha Tran Nguyen
*Assistant Examiner*—Tung X. Nguyen
(74) *Attorney, Agent, or Firm*—Posz Law Group, PLC

(57) ABSTRACT

A current sensor includes a first magnetic core that surrounds a portion of a conductor as a current path and has gaps therein, each of which is defined by adjacent ends spaced from each other by a first distance, a magnetic sensing element placed in at least one of the gaps, and a second magnetic core placed near the surrounded portion of the conductor to divide the conductor into channels. The second magnetic core is spaced from the first magnetic core by a second distance smaller than the first distance. Therefore, a magnetic resistance of the second magnetic core is smaller than that of the first magnetic core in a magnetic circuit formed by the first and second magnetic cores. As a result, a disturbance magnetic field mainly passes through the second magnetic core.

11 Claims, 4 Drawing Sheets

CURRENT SENSOR

CROSS REFERENCE TO RELATED APPLICATION

This application is based on and incorporates herein by reference Japanese Patent Application No. 2005-307482 filed on Oct. 21, 2005.

FIELD OF THE INVENTION

The present invention relates to a current sensor.

BACKGROUND OF THE INVENTION

It is known to provide a current sensor that includes a magnetic sensing element such as a Hall element or a magnetoresistance (MR) element.

When a magnetic field is applied to the Hall element, a Hall voltage is generated across the Hall element. The Hall voltage changes proportional to strength of the applied magnetic field. In contrast, when an electric current. flows through a conductor such as a busbar, the magnetic field is induced around the conductor. The strength of the induced magnetic filed changes proportional to the amount of the current flowing through the conductor. Therefore, the current sensor can detect the current flowing through the conductor by detecting the Hall voltage.

However, when the current flowing through the conductor is small, the strength of the induced magnetic field is small. When the magnetic field is small, the Hall voltage does not change proportional to the magnetic field. Therefore, the current sensor may not accurately detect the current.

A current sensor disclosed in, for example, JP-H8-15321A or JP-H11-258275 includes a magnetic core that concentrates the magnetic field to increase the strength of the magnetic field applied to the magnetic sensing element.

As shown in FIG. 7, such a conventional current sensor includes a magnetic core 11 with a center opening through which a conductor 44 passes through and a magnetic sensing element 33 such as the Hall element. The magnetic core 11 has a pair of C-shaped core members 11a, 11b facing each other to provide gaps therebetween. The magnetic sensing element 33 is placed in one of the gaps.

When the current flows through the conductor 44, the magnetic field induced around the conductor 44. The magnetic core 11 concentrates the induced magnetic field and the concentrated magnetic field is applied to the magnetic sensing element 33 placed in one of the gaps. Thus, even when the current flowing through the conductor 44 is small, the conventional current sensor may accurately detect the small current.

However, the magnetic core 11 concentrates not only the induced magnetic field but also disturbance magnetic field such as geomagnetic field. As a result, the conventional current sensor may not accurately detect the current due to magnetic saturation.

To overcome the above problem, the current sensor disclosed in JP-H8-15321 includes a magnetic shield made of high permeability material. The magnetic core and the magnetic sensing element are wrapped by the magnetic shield to be protected from the geomagnetic field. However, the addition of the magnetic shield may increase size, weight, and cost of the current sensor.

The current sensor disclosed in JP H11-258275 includes a magnetic core having a low magnetic resistance portion. The disturbance magnetic field passes through the low magnetic resistance portion. Thus, the low magnetic resistance portion acts as a magnetic shield. In the current sensor, an U-shaped conductor is used as the current path to increase strength of the magnetic field detected by the magnetic sensing element. Therefore, whereas the current sensor may accurately detect a small current, the current sensor may not accurately detect a large current due to magnetic saturation.

SUMMARY OF THE INVENTION

In view of the above-described problem, it is an object of the present invention to provide a current sensor that accurately detects a wide range of currents with a simple structure.

A current sensor includes a first magnetic core that is shaped like a ring to surround a portion of a conductor as a current path and has at least two gaps therein, each of which is defined by adjacent ends spaced from each other by a first distance, a magnetic sensing element placed in at least one of the gaps to detect a magnetic field induced by a current flowing through the conductor; and a second magnetic core placed near the surrounded portion of the conductor to divide the conductor into at least two channels.

The first magnetic core concentrates the induced magnetic field and the magnetic sensing element detects the concentrated magnetic field. Thus, even when the current flowing through the conductor is small, the current sensor can accurately detect the small current.

The second magnetic core is spaced from the first magnetic core by a second distance smaller than the first distance. Therefore, in a magnetic circuit formed by the first and magnetic cores, a magnetic resistance of the second magnetic core is smaller than that of the first magnetic core. As a result, a disturbance magnetic field such as a geomagnetic field mainly passes through the second magnetic core. Thus, the second magnetic core acts as a magnetic shield to reduce influence of the disturbance magnetic field on the magnetic sensing element. Since the disturbance magnetic field mainly passes through the second magnetic core, the first magnetic core can be prevented from being saturated even when the current flowing through the conductor is large.

The current flows through each of the channels of the conductor in the same direction. As a result, the magnetic field induced in the second magnetic core by the current flowing through one channel negates the magnetic field induced in the second magnetic core by the current flowing through another channel. Thus, even when the current flowing through the conductor is large, the second magnetic core can be prevented from being saturated.

Thus, the current sensor accurately detects the wide range of currents with the simple structure.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
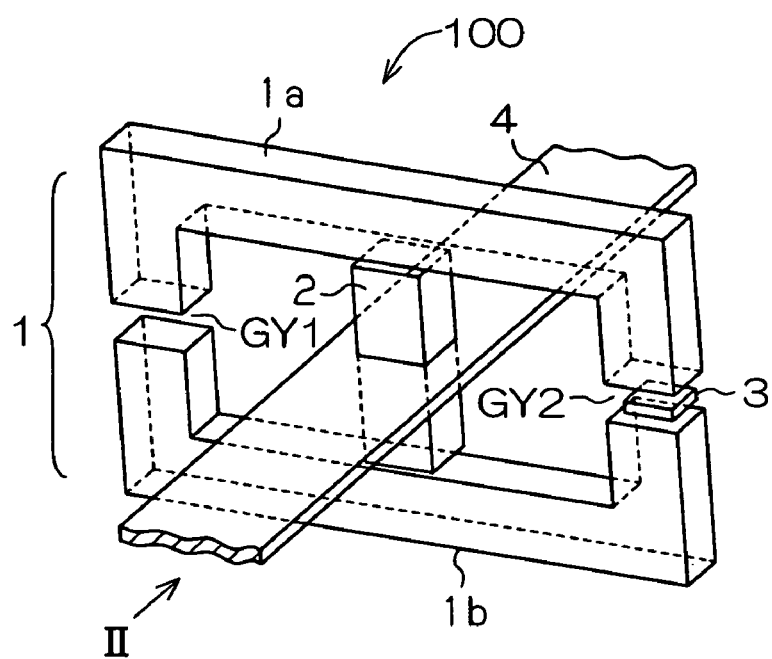
FIG. 1 is a perspective view of a current sensor according to an embodiment of the present invention.
Figure 2:
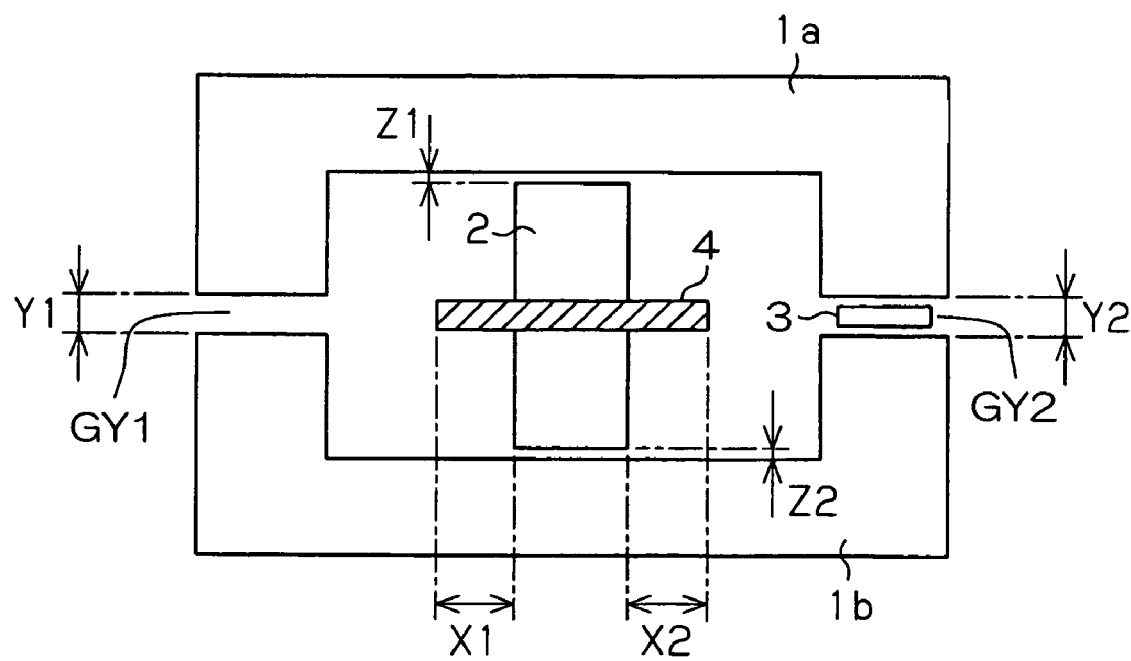
FIG. 2 is a side view of the current sensor viewed from direction indicated by an arrow II in FIG. 1.

Referring to FIGS. 1 and 2, a current sensor 100 includes a first magnetic core 1 shaped like a ring with a center opening, a second magnetic core 2 shaped like a rectangular column, and a magnetic sensing element 3 having a Hall element.

The current sensor 100 detects an electric current flowing through a busbar 4 such as a busbar that passes through the center opening of the first magnetic core 1. For example, the busbar 4 is connected to a vehicle battery and the current sensor 100 detects charging and discharging current of the battery.

The first magnetic core 1 has a pair of C-shaped core members 1a, 1b. The core members 1a, 1b face each other to provide gaps GY1, GY2 therebetween. Specifically, the gap GY1 has a width Y1 and is provided between one end of the core member 1a and one end of the core member 1b. The gap GY2 has a width Y2 and is provided between another end of the core member 1a and another end of the core member 1b. The magnetic sensing element 3 is placed in at least one of the gaps GY1, GY2. In this embodiment, the magnetic sensing element 3 is placed in the gap GY2. Since the busbar 4 passes through the center opening of the first magnetic core 1, a portion of the busbar 4 is surrounded by the first magnetic core 1.

The second magnetic core 2 is made of an electromagnetic material such as permalloy or magnetic steel. The second magnetic core 2 is placed in the center opening of the first magnetic core 1 and has a first end spaced from the core member 1a by a distance Z1 and a second end spaced from the core member 1b by a distance Z2.

The busbar 4 has a through hole on the surrounded portion. A drilling or boring machine can easily form the through hole. The second magnetic core 2 passes through the through hole to divide the busbar 4 into a first channel having a width X1 and a second channel having a width X2.

The widths X1, X2, Y1, Y2 and distances Z1, Z2 are set as follows:

$$X1 = X2 \quad (1)$$

$$Y1 = Y2 \quad (2)$$

$$Z1 = Z2 \quad (3)$$

$$Y1(Y2) > Z1(Z2) \quad (4)$$

When the current flows through the busbar 4, the magnetic field is induced around the busbar 4. The first magnetic core 1 concentrates the induced magnetic field and the concentrated magnetic field is applied to the magnetic sensing element 3 placed in the gap GY2. Thus, even when the current flowing through the busbar 4 is small, the magnetic field has sufficient strength to be detected by the magnetic sensing element 3. Therefore, the current sensor 100 can accurately detect the small current.

Figure 3A:
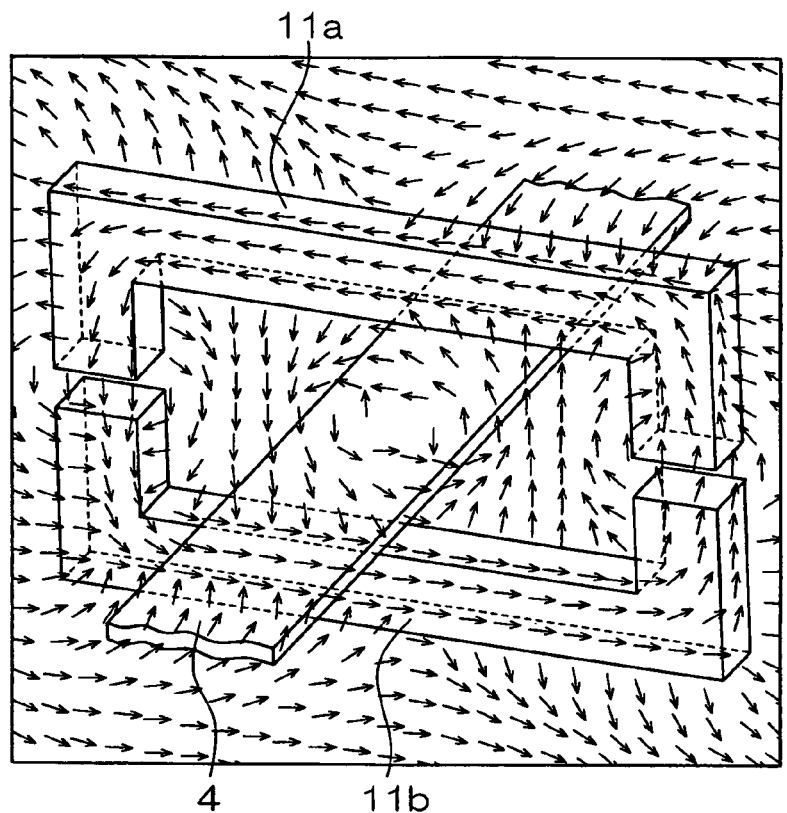
FIGS. 3A and 3B are diagrams illustrating results of simulation of magnetic flux distribution in a conventional current sensor of FIG. 7.
Figure 3B:
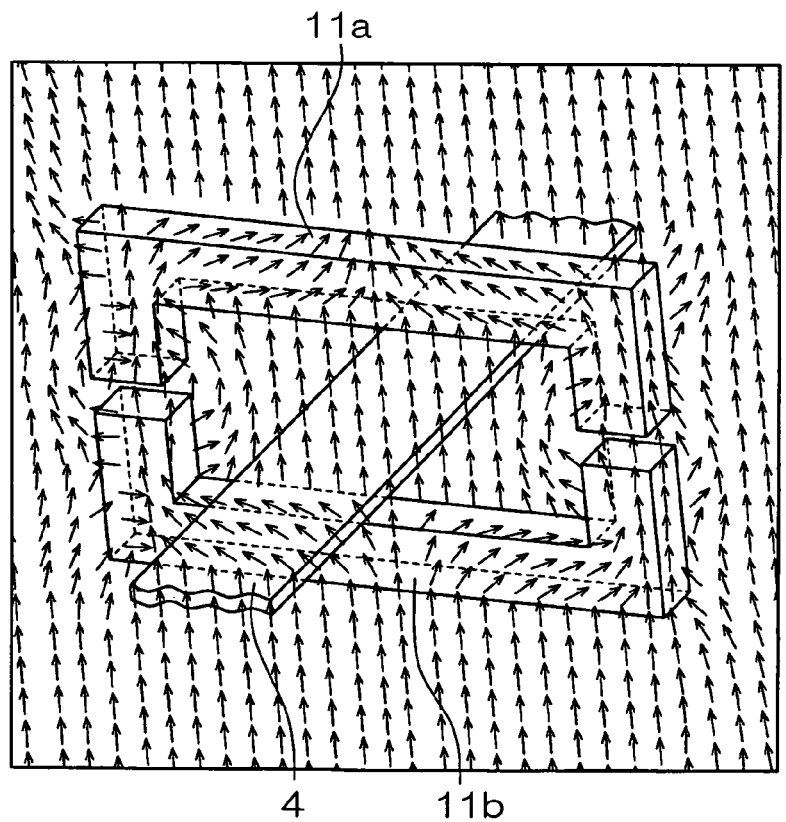
Figure 7:
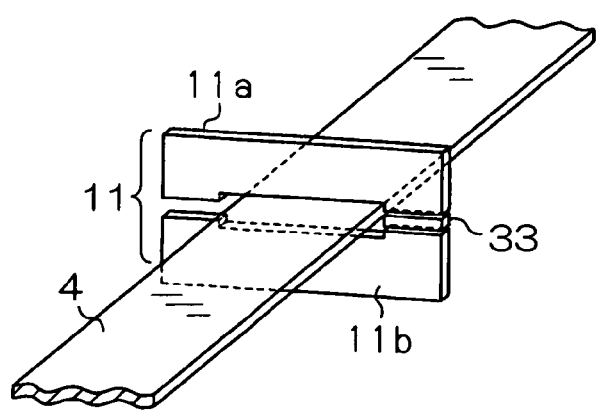
FIG. 7 is a perspective view of the conventional current sensor.

FIGS. 3A and 3B illustrate results of simulation of magnetic flux distribution in the conventional current sensor shown in FIG. 7. FIG. 3A shows a case where the current flows through the busbar 4 and FIG. 3B shows a case where no current flows through the busbar 4.

As shown in FIG. 3A, the current flowing through the busbar 4 induces a circular magnetic field around the busbar 4, according to Ampere's law. The magnetic core 11 concentrates the induced magnetic field and the conventional current sensor detects the current by detecting the concentrated magnetic field. In this case, as shown in FIG. 3B, the magnetic core 11 concentrates not only the induced magnetic field but also the disturbance magnetic field such as the geomagnetic field. Therefore, the magnetic core 11 may be saturated and the conventional current sensor may not accurately detect the current due to the magnetic saturation.

Figure 4A:
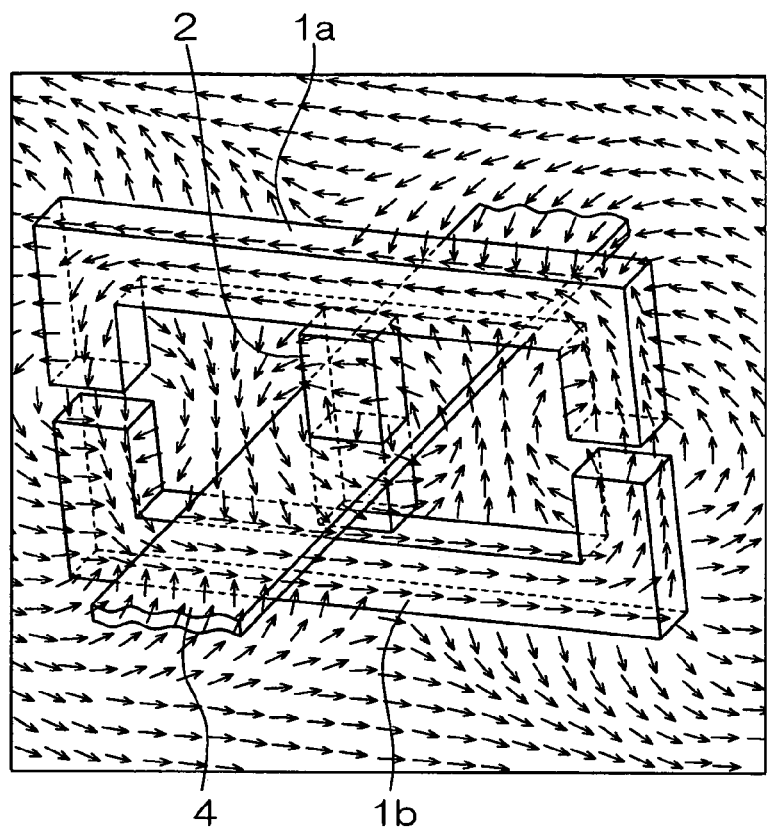
FIGS. 4A and 4B are diagrams illustrating results of simulation of magnetic flux distribution in the current sensor of FIG. 1.
Figure 4B:
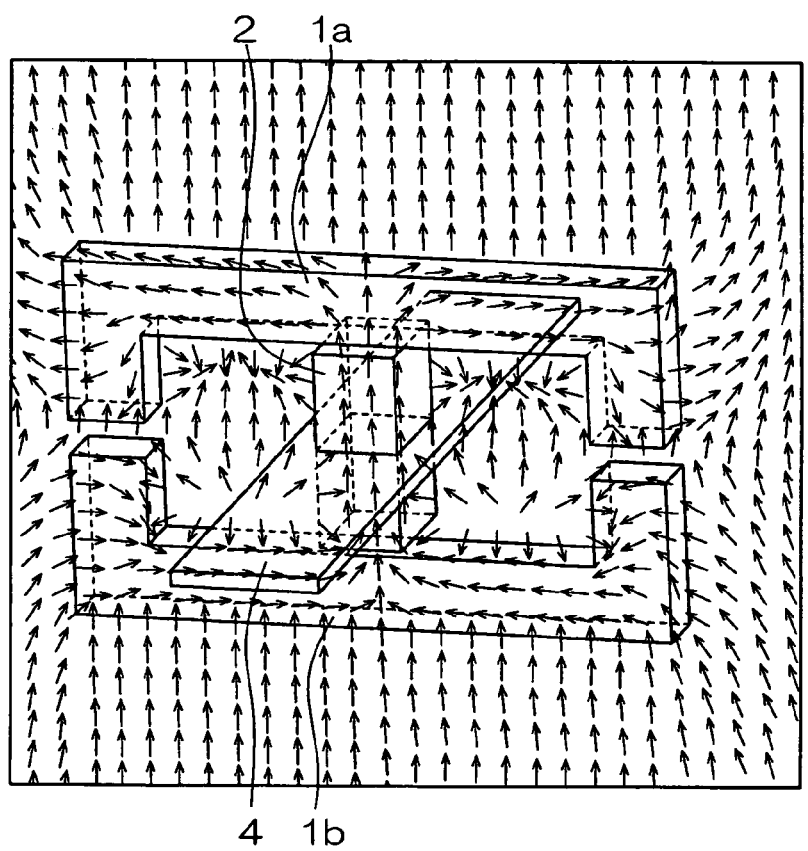

FIGS. 4A and 4B illustrate results of simulation of magnetic flux distribution in the current sensor shown in FIG. 1. FIG. 4A shows a case where the current flows through the busbar 4 and FIG. 4B shows a case where no current flows through the busbar 4.

As can be seen by comparing FIG. 4A with FIG. 3A, when the current flows through the busbar 4, the magnetic flux distribution in the current sensor 100 is similar to that in the conventional current sensor.

In contrast, as can be seen by comparing FIG. 4B with FIG. 3B, when no current flows through the busbar 4, the magnetic flux distribution in the current sensor 100 is different from that in the conventional current sensor. In the current sensor 100, the disturbance magnetic field passes through the second magnetic core 2 because the second magnetic core 2 has a small magnetic resistance. Thus, the second magnetic core 2 prevents the magnetic saturation of the first magnetic core 1 and reduces influence of the disturbance magnetic field on the magnetic field in the gaps GY1, GY2. In short, the second magnetic core 2 reduces direct influence of the disturbance magnetic field on the magnetic sensing element 3 placed in the gap GY2.

In the simulations, the disturbance magnetic field in the gaps GY1, GY2 in the current sensor 100 is one-tenth of that in the conventional current sensor. Therefore, the current sensor 100 can accurately detect a large current, as compared to the conventional current sensor.

As described above, the current sensor 100 includes the first and second magnetic cores 1, 2 and the magnetic sensing element 3. The first magnetic core 1 has the core members 1a, 1b that face each other to provide the gaps GY1, GY2 therebetween. The first magnetic core 1 concentrates the magnetic field induced by the current flowing through the busbar 4. The magnetic sensing element 3 having the Hall element is placed in the gap GY2 and detects the concentrated magnetic field.

Thus, the current sensor 100 detects the current based on the concentrated magnetic field.

The second magnetic core 2 is placed in the center opening of the first magnetic core 1. The second magnetic core 2 has the first end spaced from the first magnetic core 1 by the distance Z1 less than the width Y1 (Y2) of the gap G1 (G2) and the second end spaced from the first magnetic core 1 by the distance Z2 less than the width Y1 (Y2) of the gap G1 (G2). The second magnetic core 2 prevents the magnetic saturation of the first magnetic core 1 and reduces the direct influence of the disturbance magnetic field on the magnetic sensing element 3 placed in the gap GY2. Therefore, even when the large current flows through the busbar 4, the current sensor 100 can accurately detect the large current.

The busbar 4 has the through hole on the surrounded portion surrounded by the first magnetic core 1. The second magnetic core 2 passes through the through hole to divide the busbar 4 into the first and second channels. The current flows through the first and second channels in the same direction. As a result, the magnetic field induced in the second magnetic core 2 by the current flowing through the first channel negates the magnetic field induced in the second magnetic core 2 by the current flowing through the second channel. Since the first and second channels have the same width X1 (X2), the magnetic field induced by the first channel effectively negates the magnetic field induced by the second channel. Thus, the magnetic saturation of the second magnetic core 2 can be prevented.

Since the busbar 4 has the through hole, the second magnetic core 2 can easily divide the conductor into the first and second channels. Thus, the second magnetic core 2 can be flexibly designed to have a small magnetic resistance. The through hole can be easily formed at low cost as compared to the magnetic shield used in the current sensor in JP-H8-15321A.

Since the first magnetic core 1 is constructed from the C-shaped core members 1a, 1b, the gaps GY1, GY2, in which the magnetic sensing element 3 is placed, can be easily provided and the busbar 4 can easily pass through the center opening of the first magnetic core 1.

Since the second magnetic core has the rectangular column shape, the current sensor 100 can have a simple structure. Due to the rectangular column shape, the second magnetic core 2 can be easily formed and have a lower magnetic resistance.

Since the current sensor 100 can accurately detect the large current, the current sensor 100 can be used to detect the charging and discharging current of the vehicle battery. Therefore, performance of the vehicle can be increased using the current sensor 100.

MODIFICATIONS

The embodiment described above may be modified in various ways. For example, the second magnetic core 2 may touch the first magnetic core 1, i.e., Z1=Z2=0. In such an approach, the magnetic resistance of the second magnetic core 2 may be reduced. Alternatively, the second magnetic core 2 may be unitary with the first magnetic core 1. In such an approach, the magnetic resistance of the second magnetic core 2 (more specifically a closed magnetic circuit formed by the second magnetic core 2) may be further reduced.

Figure 5:
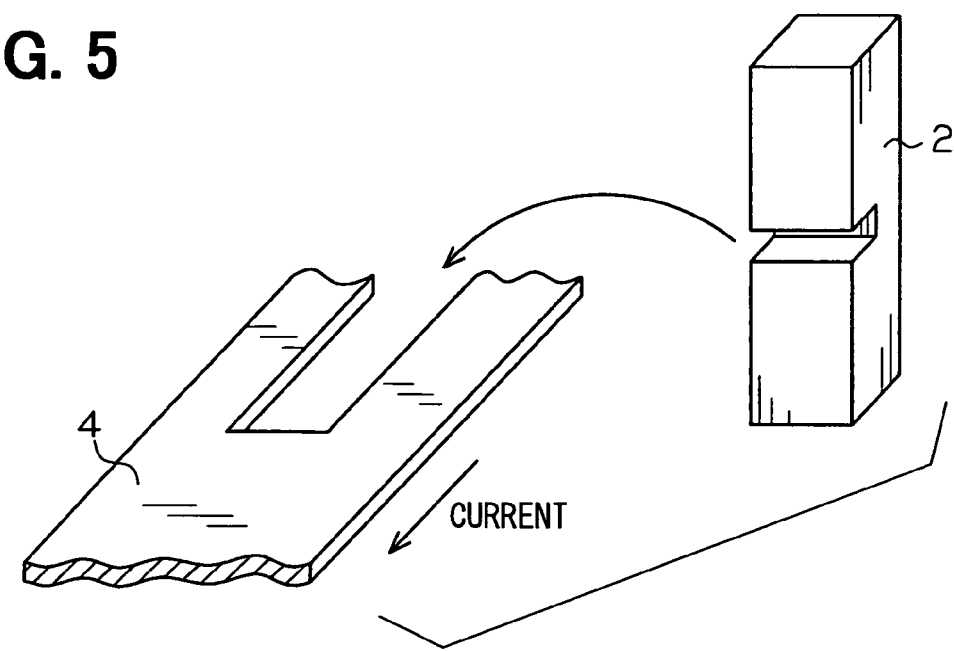
FIG. 5 is a view of a second magnetic core for shielding a magnetic field and a busbar according to a modification of the current sensor of FIG. 1.

The second magnetic core 2 can be placed in various ways to divide the busbar 4 into channels. For example, as shown in FIG. 5, the second magnetic core 2 may have a recess portion and the busbar 4 may have a cutout portion engaged with the recess portion. Thus, the busbar 4 is divided into the channels by the second magnetic core 2. In this case, it is preferable that the recess portion of the second magnetic core 2 be engaged with the cutout portion of the busbar 4 without clearance therebetween.

Figure 6A:
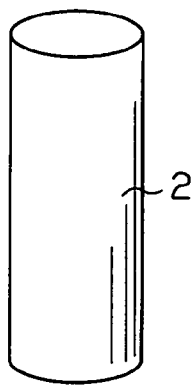
FIGS. 6A-6C are views of a second magnetic core for shielding a magnetic field according to another modification of the current sensor of FIG. 1.
Figure 6B:
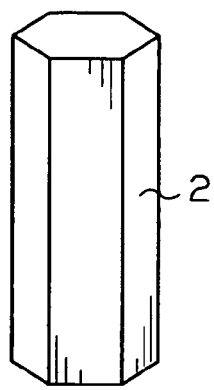
Figure 6C:
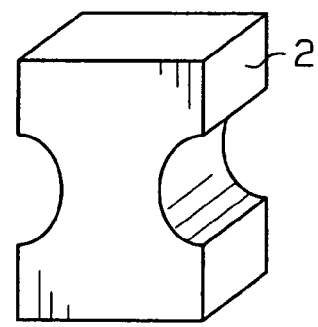

The second magnetic core 2 can have various shapes. For example, as shown in FIGS. 6A-6C, the second magnetic core 2 may be shaped like a cylindrical column, a polygonal column, or a rectangular column constricted in the middle. The second magnetic core may be placed in a location other than the surrounding portion. According to the magnetic flux distribution, the second magnetic core 2 may be placed in an optimum location to shield the disturbance magnetic field.

The busbar 4 may be divided into multiple channels by multiple second magnetic cores 2. The width X1 of the first channel may be different from the width X2 of the second channel.

The first magnetic core 1 may be constructed from more than two core members. The first magnetic core 1 may be constructed from U-shaped core members or a combination of the C-shaped core member and the U-shaped core member.

Various types of magnetic sensing elements such as a MR element can be used as the magnetic sensing element 3. The magnetic sensing element 3 may be integrated into a semiconductor chip. The magnetic sensing element 3 may be placed in each of the gaps GY1, GY2. Two or more magnetic sensing elements 3 may be placed in one or each of the gaps GY1, GY2.

The conductor 5 may be placed in a location other than the center opening of the first magnetic core 1 according to applications of the current sensor 100.

The current sensor 100 has wide applications in various fields.

Such changes and modifications are to be understood as being within the scope of the present invention as defined by the appended claims.

What is claimed is:

1. A current sensor for detecting current flowing through a conductor, the current sensor comprising:
    a first magnetic core that is shaped like a ring to surround a portion of the conductor, the first magnetic core having at least two gaps therein, each of which is defined by adjacent ends spaced from each other by a first distance;
    a magnetic sensing element placed in at least one of the gaps to detect a magnetic field induced in the first magnetic core by the current flowing through the conductor; and
    a second magnetic core placed near the surrounded portion of the conductor to divide the conductor into at least two channel portions, wherein
    a second distance between the first and second magnetic cores is smaller than the first distance.

2. The current sensor according to claim 1, wherein
    the second magnetic core penetrates through the surrounded portion of the conductor.

3. The current sensor according to claim 1, wherein
    each of the channel portions has a same width.

4. The current sensor according to claim 3, wherein
    the second magnetic core divides the conductor into two channel portions.

5. The current sensor according to claim 1, wherein
    the first and second magnetic cores touch each other.

6. The current sensor according to claim 1, wherein
    the first and second magnetic cores are unitary with each other.

7. The current sensor according to claim 1, wherein
    the first magnetic core includes a plurality of core members, and
    each of the gaps is defined by adjacent ends of the core members.

8. The current sensor according to claim 7, wherein the first magnetic core includes a pair of C-shaped core members, a pair of U-shaped core members, or a pair of one C-shaped core member and one U-shaped core member.

9. The current sensor according to claim 1, wherein the second magnetic core is shaped like a column.

10. The current sensor according to claim 9, wherein the second magnetic core is shaped like a cylindrical column or a polygonal column.

11. The current sensor according to claim 1, wherein the conductor is connected to a battery of a vehicle.

* * * * *